(12) United States Patent
Jaber et al.

(10) Patent No.: US 8,321,730 B2
(45) Date of Patent: Nov. 27, 2012

(54) SCAN ARCHITECTURE AND DESIGN METHODOLOGY YIELDING SIGNIFICANT REDUCTION IN SCAN AREA AND POWER OVERHEAD

(75) Inventors: Talal K. Jaber, Austin, TX (US); David M. Wu, Pflugerville, TX (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 12/648,812

(22) Filed: Dec. 29, 2009

(65) Prior Publication Data

US 2011/0161759 A1     Jun. 30, 2011

(51) Int. Cl.
*G01R 31/3177*   (2006.01)
*G01R 31/40*   (2006.01)

(52) U.S. Cl. ........................................ 714/731; 714/733

(58) Field of Classification Search .................. None
See application file for complete search history.

(56) References Cited

U.S. PATENT DOCUMENTS

| | | | | |
|---|---|---|---|---|
| 5,717,701 | A * | 2/1998 | Angelotti et al. | 714/30 |
| 5,774,476 | A * | 6/1998 | Pressly et al. | 714/726 |
| 7,406,642 | B1 * | 7/2008 | Lau | 714/727 |
| 2003/0097614 | A1 * | 5/2003 | Rajski et al. | 714/30 |
| 2004/0225938 | A1 * | 11/2004 | Smith | 714/726 |

FOREIGN PATENT DOCUMENTS

JP          09218249 A   *   8/1997

* cited by examiner

*Primary Examiner* — John Trimmings
*Assistant Examiner* — Dipakkumar Gandhi
(74) *Attorney, Agent, or Firm* — Schwegman, Lundberg & Woessner, P.A.

(57) ABSTRACT

A scan architecture and design methodology yielding significant reduction in scan area and power overhead is generally presented. In this regard, an apparatus is introduced comprising a plurality of combinatorial logic clouds, scan cells coupled with the combinatorial logic clouds, the scan cells to load test vectors, wherein the scan cells comprise a plurality of first type scan cells and second type scan cells sequentially coupled with separate combinatorial logic cloud outputs, and a first scan clock and a second scan clock, wherein the first scan clock controls the first type scan cells and the second scan clock controls the second type scan cells. Other embodiments are also described and claimed.

20 Claims, 5 Drawing Sheets

US 8,321,730 B2

SCAN ARCHITECTURE AND DESIGN METHODOLOGY YIELDING SIGNIFICANT REDUCTION IN SCAN AREA AND POWER OVERHEAD

FIELD

Embodiments of the present invention may relate to the field of microprocessor design and testing, and more specifically to a scan architecture and design methodology yielding significant reduction in scan area and power overhead.

BACKGROUND

Scan chains are commonly included in integrated circuit devices to load test vectors and test for faults within logic devices during a manufacturing test process. Scan chains, however, can take up considerable space within a device due to component and routing requirements.

BRIEF DESCRIPTION OF THE DRAWINGS

Embodiments of the present invention may become apparent from the following detailed description of arrangements, example embodiments, and the claims when read in connection with the accompanying drawings. While the foregoing and following written and illustrated disclosure focuses on disclosing arrangements and example embodiments of the invention, it should be clearly understood that the same is by way of illustration and example only and embodiments of the invention are not limited thereto.

The following represents brief descriptions of the drawings in which like reference numerals represent like elements and wherein.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
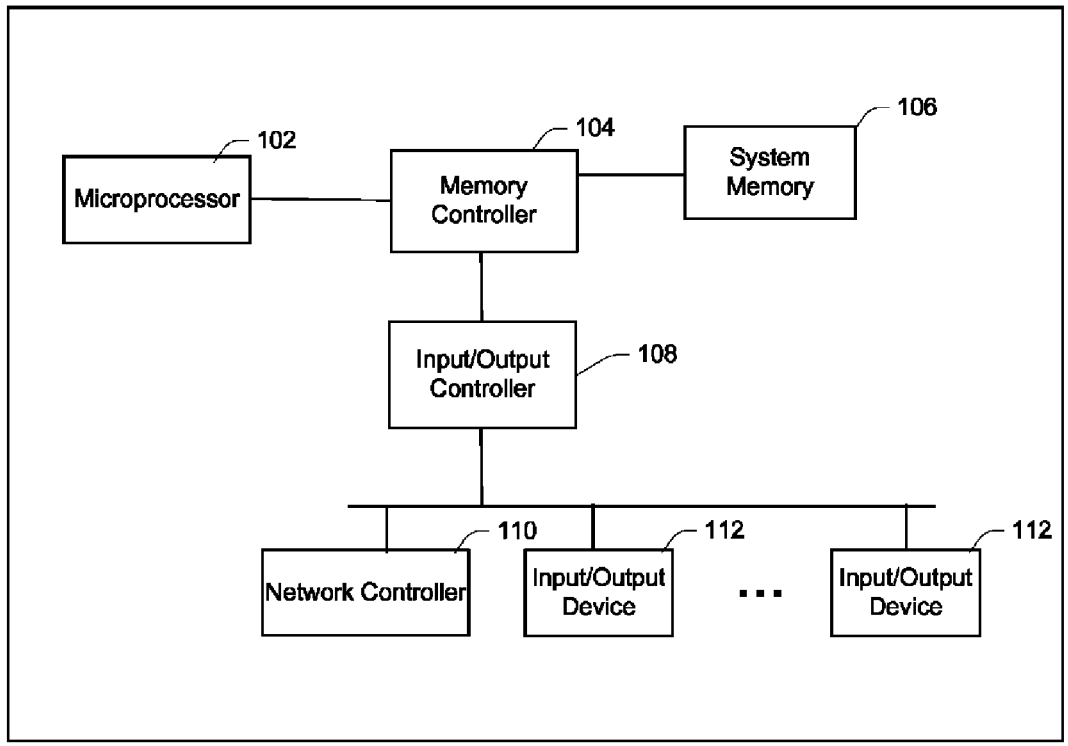
FIG. 1 is a block diagram of an example electronic appliance suitable for implementing a scan architecture presented herein, in accordance with one example embodiment of the invention.

FIG. 1 is a block diagram of example electronic appliance suitable for implementing a scan architecture presented herein, in accordance with one example embodiment of the invention. Electronic appliance 100 is intended to represent any of a wide variety of traditional and non-traditional electronic appliances, laptops, cell phones, wireless communication subscriber units, personal digital assistants, or any electric appliance that would benefit from the teachings of the present invention. In accordance with the illustrated example embodiment, electronic appliance 100 may include one or more of microprocessor 102, memory controller 104, system memory 106, input/output controller 108, network controller 110, and input/output device(s) 112 coupled as shown in FIG. 1.

Microprocessor 102 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, microprocessor 102 is an Intel® compatible processor. Microprocessor 102 may have an instruction set containing a plurality of machine level instructions that may be invoked, for example by an application or operating system. Microprocessor 102 may include elements as described in greater detail in regards to FIG. 2.

Memory controller 104 may represent any type of chipset or control logic that interfaces system memory 106 with the other components of electronic appliance 100. In one embodiment, a link which communicatively couples microprocessor 102 and memory controller 104, may be a high speed/frequency serial link such as Intel® QuickPath Interconnect. In another embodiment, memory controller 104 may be incorporated along with microprocessor 102 into an integrated package.

System memory 106 may represent any type of memory device(s) used to store data and instructions that may have been or will be used by microprocessor 102. Typically, though the invention is not limited in this respect, system memory 106 will consist of dynamic random access memory (DRAM). In one embodiment, system memory 106 may consist of Rambus DRAM (RDRAM). In another embodiment, system memory 106 may consist of double data rate synchronous DRAM (DDRSDRAM).

Input/output (I/O) controller 108 may represent any type of chipset or control logic that interfaces I/O device(s) 112 with the other components of electronic appliance 100. In one embodiment, I/O controller 108 may be referred to as a south bridge. In another embodiment, I/O controller 108 may comply with the Peripheral Component Interconnect (PCI) Express™ Base Specification, Revision 1.0a, PCI Special Interest Group, released Apr. 15, 2003 and/or other revisions.

Network controller 110 may represent any type of device that allows electronic appliance 100 to communicate with other electronic appliances or devices. In one embodiment, network controller 110 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 110 may be an Ethernet network interface card.

Input/output (I/O) device(s) 112 may represent any type of device, peripheral or component that provides input to or processes output from electronic appliance 100.

Figure 2:
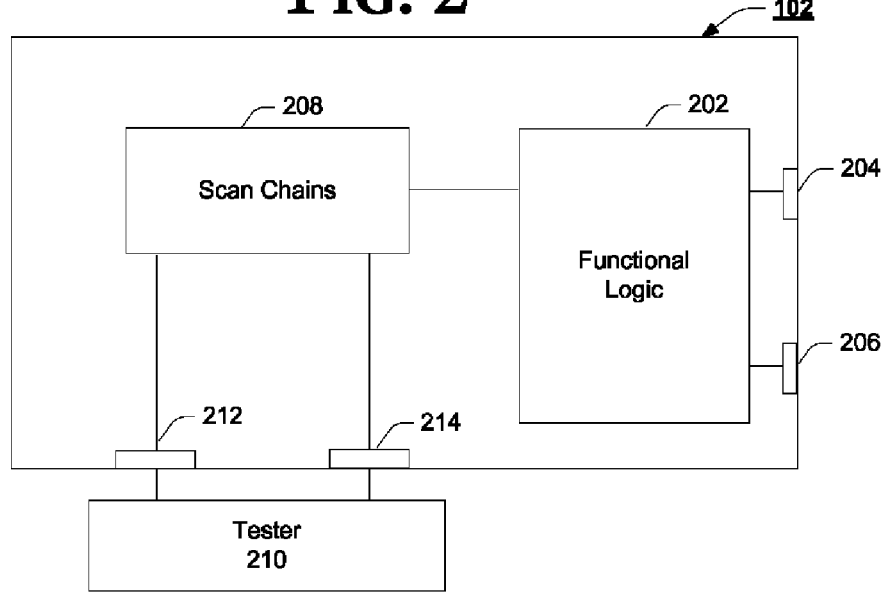
FIG. 2 is a block diagram of an example microprocessor suitable for implementing a scan architecture presented herein, in accordance with one example embodiment of the invention.

FIG. 2 is a block diagram of an example microprocessor suitable for implementing a scan architecture presented herein, in accordance with one example embodiment of the invention. Microprocessor 102 may include functional logic 202, primary inputs 204, primary outputs 206, scan chains 208, scan inputs 212 and scan outputs 214 as shown. Microprocessor 102 may be coupled with tester 210 as part of manufacturing testing process.

Functional logic 202 represents the logical and functional elements of microprocessor 102. In some examples, functional logic 202 may include processor cores, floating point units, controllers, registers, pointers, etc.

Primary inputs 204 and primary outputs 206 provide a communication connection between microprocessor 102 and other components, for example components of electronic appliance 100.

Scan chains 208 include series of scan cells to load test vectors in functional logic 202. Test vectors may be shifted into scan chains 208 by tester 210 through scan inputs 212 and shifted out through scan outputs 214.

While shown as separate blocks, scan chains 208 and functional logic 202 may be interconnected with functional logic 202 arranged in combinatorial logic clouds. One example scan architecture, which may be used with the present invention, is described in U.S. Pat. No. 7,216,274 issued to Talal K. Jaber, et al. on May 8, 2007, which is hereby incorporated by reference in its entirety.

Figure 3:
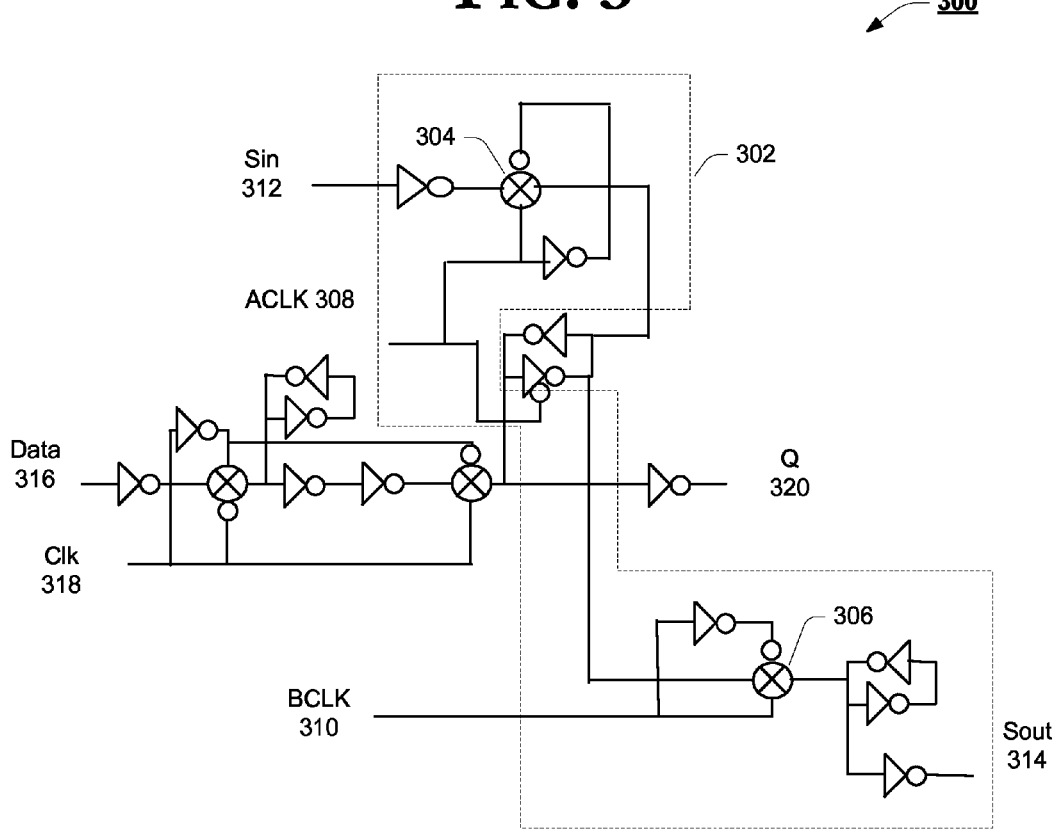
FIG. 3 is a block diagram of an example conventional scan cell.

FIG. 3 is a block diagram of an example conventional scan cell. Scan cell 300 may include scan gadget 302, first transmission gate 304, second transmission gate 306, first scan clock 308, second scan clock 310, scan input 312, scan output 314, data input 316, system clock 318 and function output 320 as shown. First transmission gate 304 and second transmission gate 306 may act as control and observe test points, respectively, where test data is shifted in through scan input 312 using first scan clock 308 and shifted out through scan output 314 using second scan clock 310. Test data may also be applied to data input 316 using system clock 318 as part of a process to test function output 320.

Figure 4:
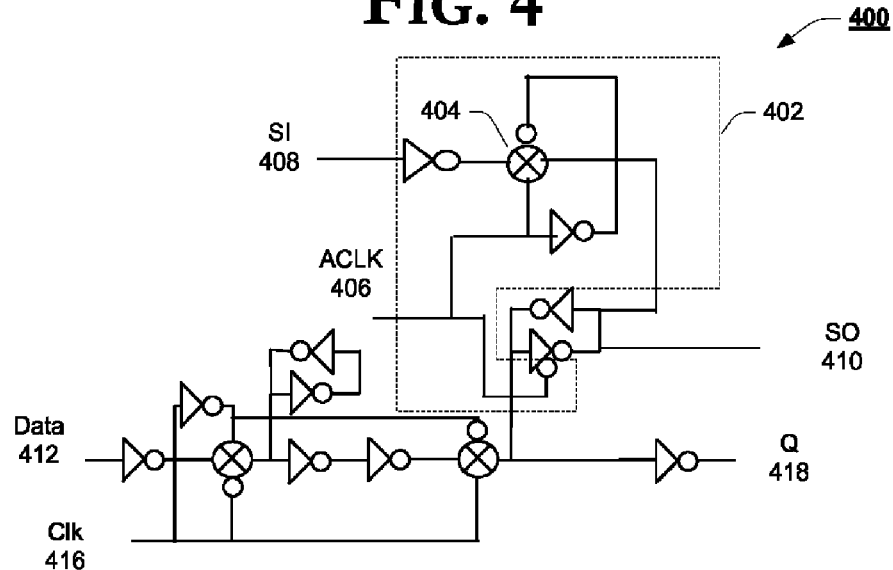
FIG. 4 is a block diagram of an example first type scan cell, in accordance with one example embodiment of the invention.

FIG. 4 is a block diagram of an example first type scan cell, in accordance with one example embodiment of the invention. Scan cell 400 may include scan gadget 402, transmission gate 404, scan clock 406, scan input 408, scan output 410, data input 412, system clock 416 and function output 418 as shown.

Figure 5:
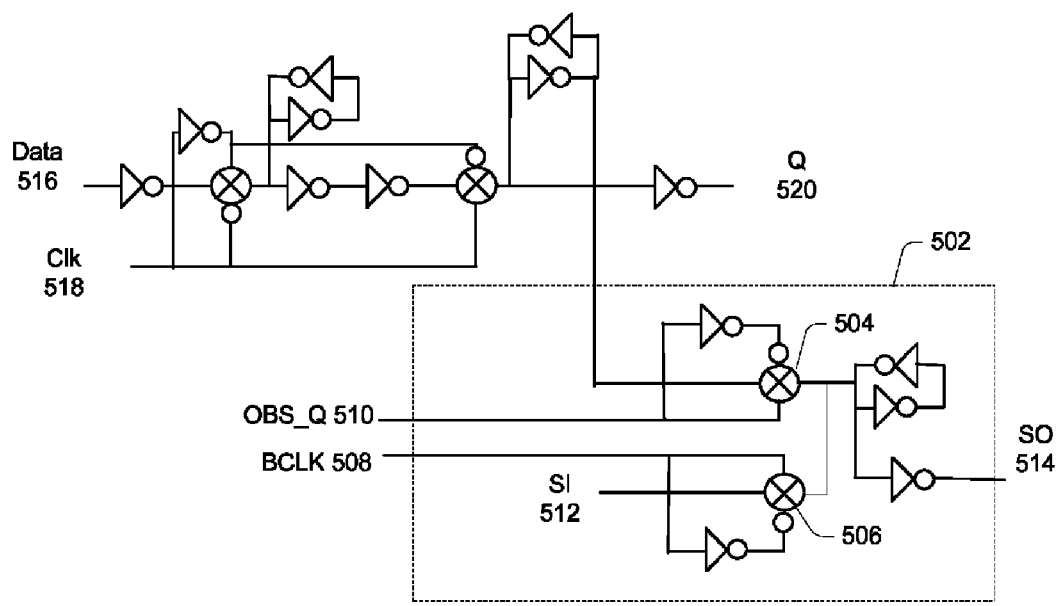
FIG. 5 is a block diagram of an example second type scan cell, in accordance with one example embodiment of the invention.

FIG. 5 is a block diagram of an example second type scan cell, in accordance with one example embodiment of the invention. Scan cell 500 may include scan gadget 502, first transmission gate 504, second transmission gate 506, scan clock 508, control signal 510, scan input 512, scan output 514, data input 516, system clock 518 and function output 520 as shown.

Second transmission gate 506 allows for capturing and observing of function output 520, which can be used for debug and test purposes.

One skilled in the art would appreciate that a distributed sharing of scan gadget 302 across two sequential cells 400 and 500, as opposed to a single sequential cell 300, can result in the scan clocks routing and scan gadget hardware requirements being significantly reduced.

Figure 6:
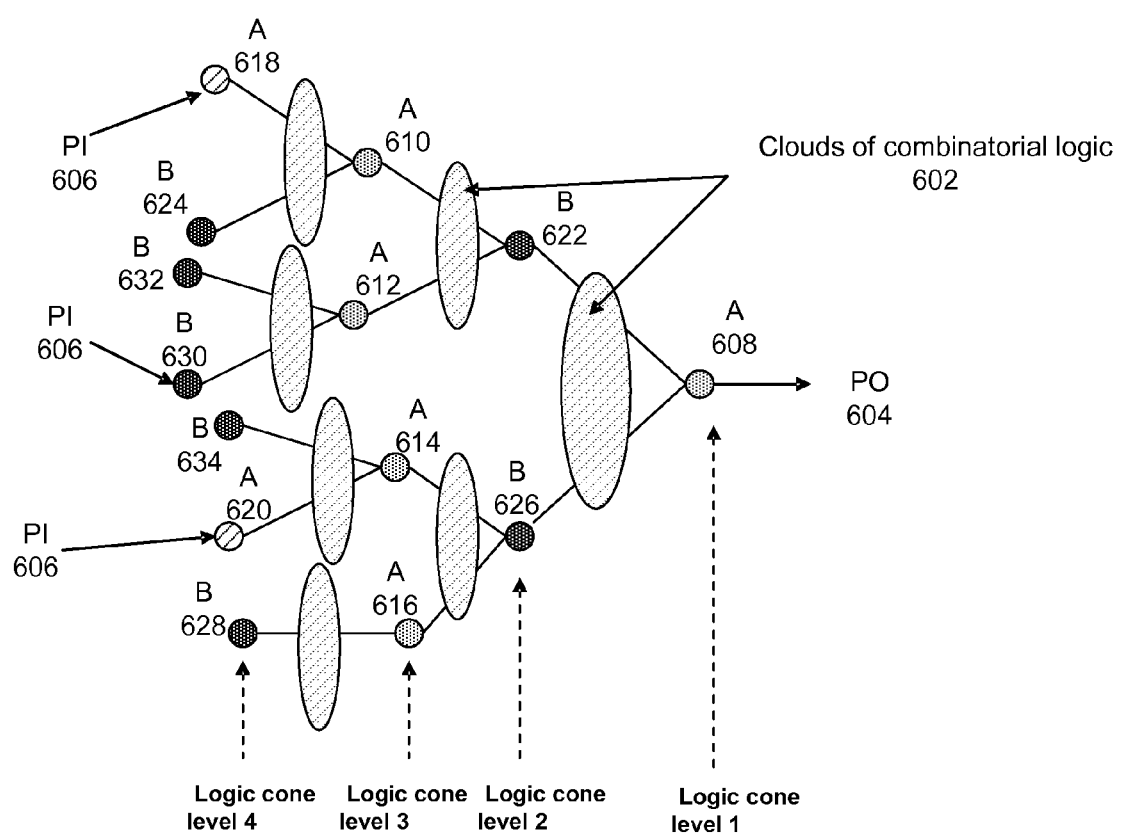
FIG. 6 is a block diagram of an example functional block sequential and combinatorial topology, in accordance with one example embodiment of the invention.

FIG. 6 is a block diagram of an example functional block sequential and combinatorial topology, in accordance with one example embodiment of the invention. Functional block 600 may include clouds of combinatorial logic 602, primary output 604, primary inputs 606, type A scan cells 608-620 and type B scan cells 622-634 as shown. In this example embodiment, A scan cells refer to first type scan cells 400 and B scan cells refer to second type scan cells 500. A and B scan cells may be selected based on an algorithm for scan cell configuration, for example as described in reference to FIG. 7. Clouds of combinatorial logic 602 may be comprised of functional logic 202 and may for scan architecture purposes be configured in a cone configuration or topology.

Figure 7:
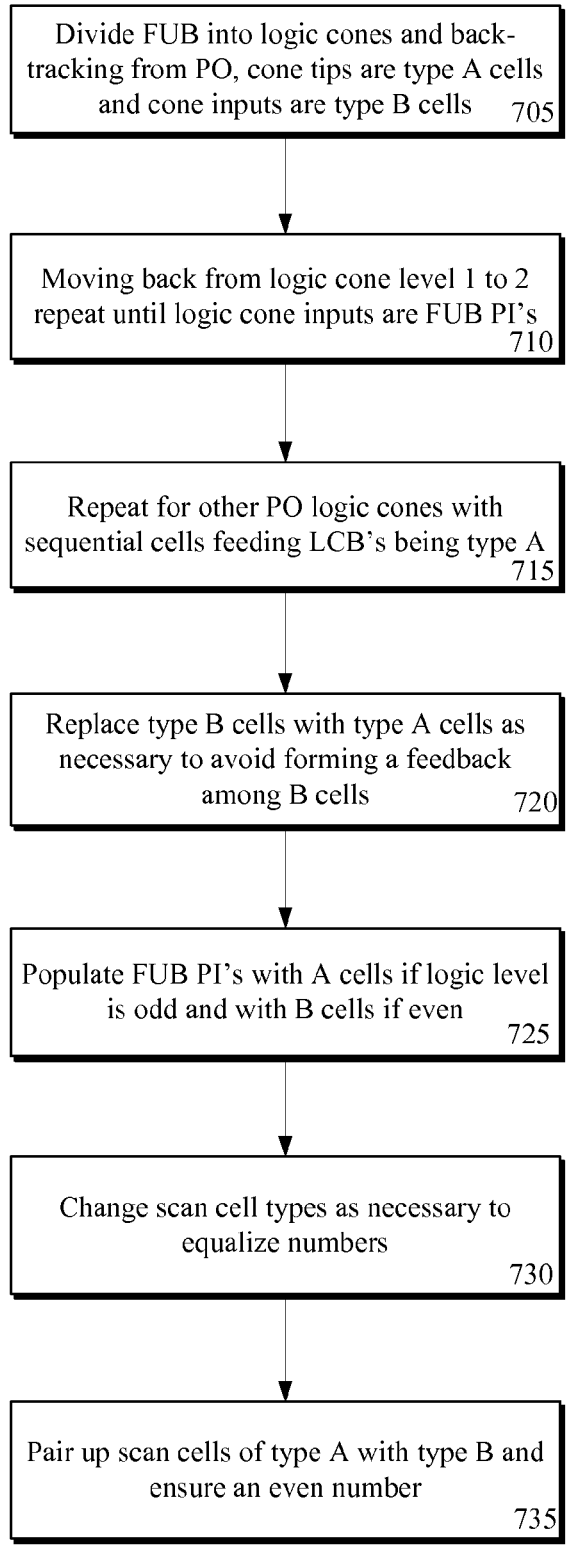
FIG. 7 is a flowchart of an example algorithm for scan cell configuration, in accordance with one example embodiment of the invention.

FIG. 7 is a flowchart of an example algorithm for scan cell configuration, in accordance with one example embodiment of the invention. Method 700, which may be implementing as part of a microprocessor design for testability (DFT) process, begins with dividing (705) functional blocks into logic cones and back-tracking from primary outputs cone tips are made type A cells (for example A scan cell 608) and cone inputs are made type B cells (for example B scan cells 622 and 626). Next, the algorithm calls for moving (710) back from logic cone level 1 to 2 and repeated the sequence until you hit logic cones with inputs being the functional block primary inputs (for example, primary inputs 606).

The method continues with repeating (715) for other primary output logic cones with sequential cells feeding logical clock buffers (LCB's, not shown), which are circuit cells within the functional logic, being made type A cells. Next is replacing (720) type B cells with type A cells as necessary to avoid forming a feedback among B cells. The method continues with populating (725) functional block primary inputs (for example primary inputs 606) with A cells if logic level is odd or with B cells (for example B cell 630) if even.

The method may continue with changing (730) scan cell types as necessary to equalize numbers (for example A cells 618 and 620, which were changed from B cells). Lastly, pairing up (735) of scan cells of type A with type B that is closest physically is done and a spare cell may need to be added to ensure an even number. In the case of functional block 600, A cell 608 may be paired with B cell 622, A cell 610 may be paired with B cell 624, A cell 612 may be paired with B cell 630, A cell 614 may be paired with B cell 626, A cell 616 may be paired with B cell 628, A cell 618 may be paired with B cell 632, and A cell 620 may be paired with B cell 634.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An apparatus comprising:
   a plurality of combinatorial logic clouds;
   scan cells coupled with the combinatorial logic clouds, the scan cells to load test vectors, wherein the scan cells comprise a plurality of first type scan cells and second type scan cells coupled in an alternating sequence with separate combinatorial logic cloud outputs; and a first scan clock and a second scan clock, wherein the first scan clock controls the first type scan cells and the second scan clock controls the second type scan cells.

2. The apparatus of claim 1, wherein the second type scan cells each comprise an additional transmission gate compared to the first type scan cells.

3. The apparatus of claim 2, further comprising the additional transmission gate to capture a cell function output.

4. The apparatus of claim 2, further comprising the additional transmission gate is controlled by an additional control signal.

5. The apparatus of claim 1, further comprising the combinatorial logic arranged in a cone configuration.

6. The apparatus of claim 5, further comprising a cone primary output coupled with a first type scan cell.

7. A microprocessor comprising:
functional logic to process data, wherein the functional logic is arranged in combinatorial logic clouds; and
scan chains to load a test vector in the functional logic during a test process, wherein the scan chains comprise first type scan cells and second type scan cells coupled in an alternating sequence with the combinatorial logic clouds.

8. The microprocessor of claim 7, wherein the scan chains further comprise a first scan clock and a second scan clock, wherein the first scan clock controls the first type scan cells and the second scan clock controls the second type scan cells.

9. The microprocessor of claim 7, wherein the first type scan cells each comprise one transmission gate.

10. The microprocessor of claim 7, further comprising the second type scan cells each comprise two transmission gates.

11. The microprocessor of claim 7, further comprising the first type scan cells and second type scan cells comprise a substantially same quantity.

12. The microprocessor of claim 7, further comprising the second type scan cells to capture a cell function output.

13. The microprocessor of claim 7, further comprising the second type scan cells comprising an additional control signal.

14. A system comprising:
a network controller;
a system memory; and
a microprocessor, wherein the microprocessor comprises:
a plurality of combinatorial logic clouds;
scan cells coupled with the combinatorial logic clouds, the scan cells to load test vectors, wherein the scan cells comprise a plurality of first type scan cells and second type scan cells coupled in an alternating sequence with separate combinatorial logic cloud outputs; and
a first scan clock and a second scan clock, wherein the first scan clock controls the first type scan cells and the second scan clock controls the second type scan cells.

15. The system of claim 14, wherein the second type scan cells each comprise two transmission gates.

16. The system of claim 15, wherein one of the transmission gates to capture a cell function output.

17. The system of claim 16, further comprising the combinatorial logic arranged in a cone configuration.

18. The system of claim 17, further comprising a cone primary output coupled with a first type scan cell.

19. The system of claim 17, further comprising a cone primary input coupled with a second type scan cell.

20. The system of claim 16, further comprising an even number of scan cells.

* * * * *